Figure 1:
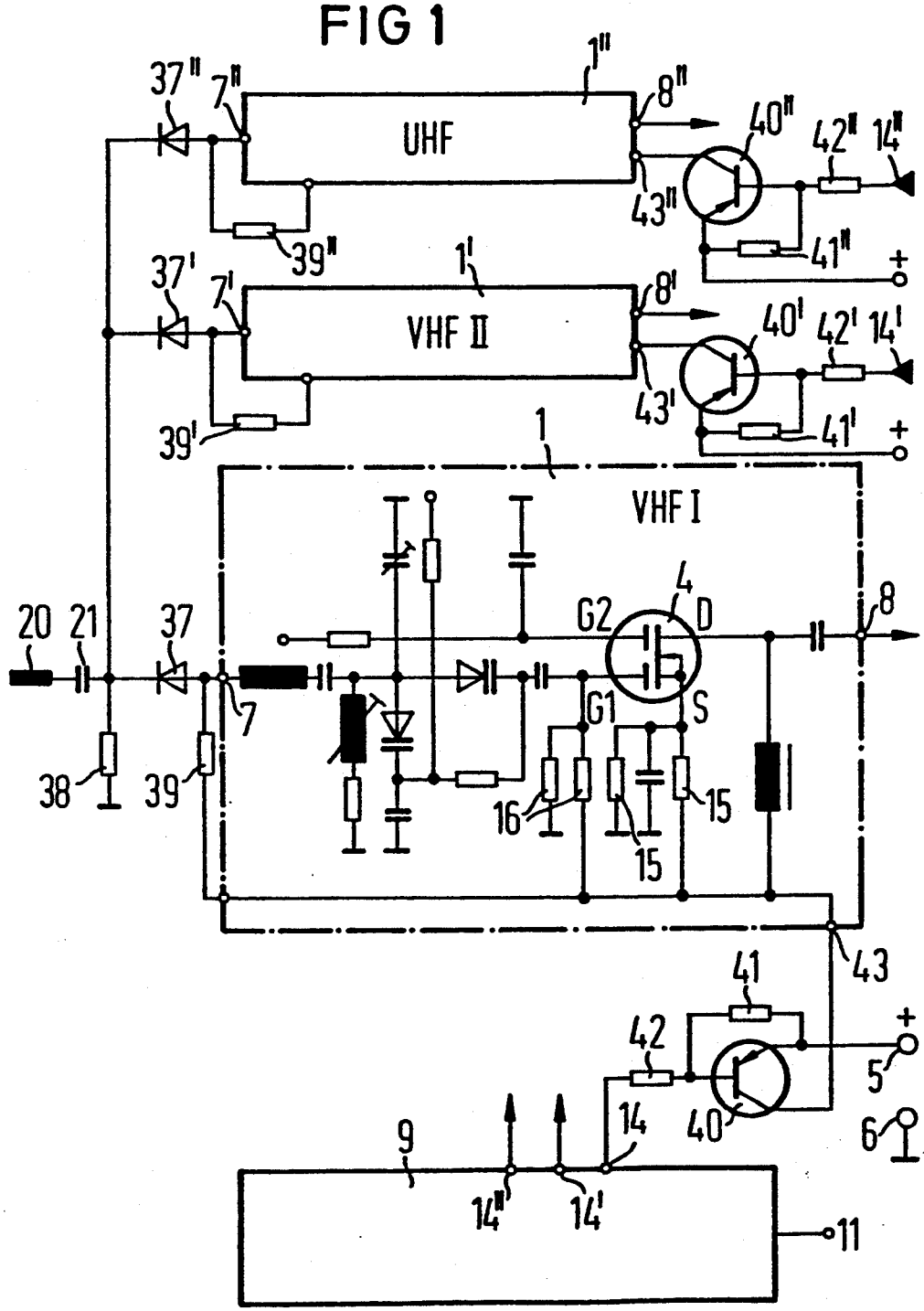

United States Patent [19]
Hohmann

[11] Patent Number: 5,204,645
[45] Date of Patent: Apr. 20, 1993

[54] CIRCUIT CONFIGURATION FOR RANGE SWITCHING IN TUNERS

[75] Inventor: Henning Hohmann, München, Fed. Rep. of Germany

[73] Assignee: Siemens Aktiengesellschaft, Munich, Fed. Rep. of Germany

[21] Appl. No.: 703,197

[22] Filed: May 20, 1991

[30] Foreign Application Priority Data

May 21, 1990 [EP] European Pat. Off. ............ 90109584

[51] Int. Cl.$^5$ .................................................. H03J 5/24
[52] U.S. Cl. ............................................ 334/1; 334/15; 334/47; 455/188.2
[58] Field of Search .................... 334/1, 11, 15, 47; 455/150.1, 188.1, 188.2, 191.2, 191.3, 195.1

[56] References Cited

U.S. PATENT DOCUMENTS

| | | |
|---|---|---|
| 4,048,598 | 9/1977 | Knight ................... 334/15 |
| 4,442,548 | 4/1984 | Lehmann . |
| 4,461,038 | 7/1984 | Miyoshi ............... 334/15 X |
| 4,590,612 | 5/1986 | Ijichi ........................ 334/1 |
| 4,823,099 | 4/1989 | Leipert ................... 334/15 |

FOREIGN PATENT DOCUMENTS 0299578 1/1989 European Pat. Off. .

OTHER PUBLICATIONS

"ICs für die Unterhaltungselektronik" 1986, *Siemens Dalenbuch:* pp. 767–768.

Primary Examiner—Paul Gensler
Attorney, Agent, or Firm—Herbert L. Lerner; Laurence A. Greenberg

[57] ABSTRACT

A circuit configuration for range switching in tuners having at least two ranges includes at least two preselector stages each being assigned to a respective tuner range. Each of the preselector stages is connected between a supply potential terminal and a reference potential terminal. Each of the preselector stages has an input terminal, an output terminal and an MOS tetrode with a source terminal. A switchgear has switch outputs to be connected to the reference potential terminal for activating each of the MOS tetrodes. At least one resistor is connected between the source terminal of at least one of the MOS tetrodes and at least one of the switch outputs.

6 Claims, 2 Drawing Sheets

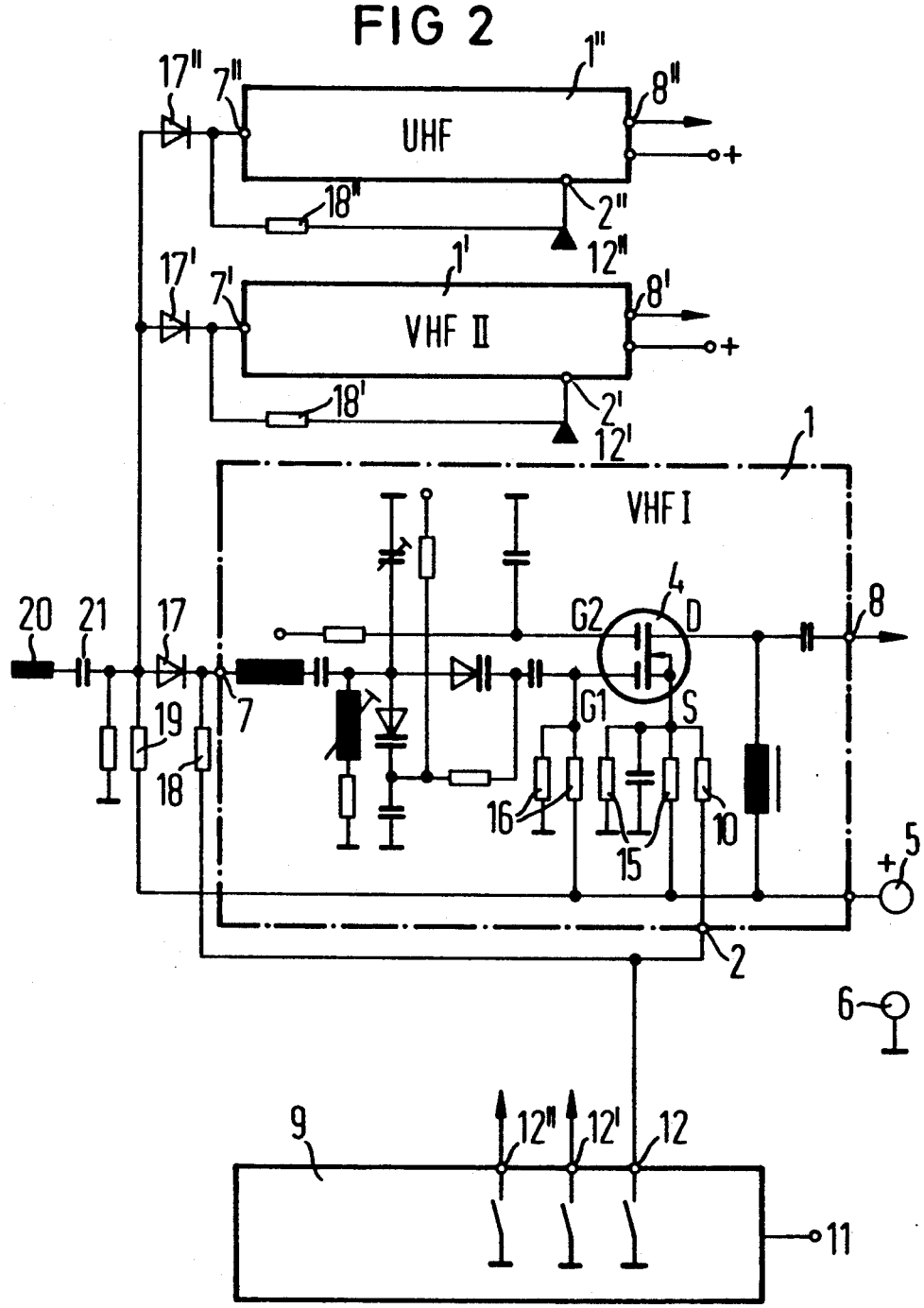

CIRCUIT CONFIGURATION FOR RANGE SWITCHING IN TUNERS

Specification:

The invention relates to a circuit configuration for range switching in tuners with at least two ranges, each having one preselector stage connected between a supply potential terminal and a reference potential terminal, each preselector stage having an input terminal, an output terminal and an MOS tetrode, each MOS tetrode being activatable through a switchgear.

Television tuners typically include two or three sub-tuners, which are operated electrically largely independently of one another and cover the television frequency ranges in the VHF bands and in the UHF band. For the two or three VHF ranges, conventional tuners use shared oscillator circuits having partial inductances which are switched over with direct voltage controlled switch diodes for changing ranges.

Switching between the VHF and UHF ranges is carried out by means of pnp switch transistors, having emitters connected to the supply voltage terminal and collectors connected to the subtuner. The base terminals are connected to circuit outputs of an integrated circuit, generally a PLL circuit. Such circuit outputs are current-limited open collector outputs, which come to have low impedance and supply the subtuner with voltage through the corresponding switch transistor when a range is selected by the control elements of the TV set. An internal current limitation in the integrated circuit prevents an overly high base current of the switch transistor. The switchover among the VHF ranges is effected due to the fact that the switch transistor triggered by the integrated circuit brings the necessary currents to bear for activating the switch diodes.

Hyperband tuners, that is tuners that cover the hyperband, which is also distributed in cable systems, in a frequency range from 300 to 470 MHz, as a rule include three electrically independent subtuners. As a rule, band or range changing of the tuned oscillator circuits is not carried out with switch diodes, because of the wide frequency ranges to be tuned. In contrast, switch diodes that switch only the range just selected to the antenna connection of the TV set, are used directly at the antenna input. Switchover of the subtuners and switch diodes is effected by means of switch transistors, as described above.

In many hyperband tuners, an integrated circuit is currently used, which contains one mixer and one oscillator for each subrange. Also integrated into the integrated circuit is switchgear that turns on the desired mixer and oscillator by application of a predetermined control signal, such as voltage levels. For instance, the control signal may be derived through suitably constructed voltage dividers, from switched-over operating voltages for the subtuners. In that case, the switch transistors switch only the current of the switch diodes and the operating voltage of the preselector stages of the tuner, in which MOS tetrodes are typically used to amplify the high frequency. Two circuit configurations for range switching in television tuners with MOS tetrodes and an integrated circuit for VHF/UHF switchover are described, for instance, on pages 767 and 768 of the 1986/87 Siemens Data Book, entitled "ICs für die Unterhaltungselektronik" [ICs for Consumer Electronics].

A known hyperband tuner designated UV 816 from the firm Philips, does not need any switch transistors. That is achieved by means of an integrated switchgear with non-current-limited switch outputs, by way of which the first gate terminals of the MOS tetrodes that are not to be turned on are applied to ground. That makes these MOS tetrodes currentless so that they lose their amplification. Only the MOS tetrode of the active range remains on, due to the fact that the switch output of the integrated switchgear, that is intended for this purpose, continues to have high impedance and thus remains inactive. A disadvantage of such a principle is the following:

For its control, such a tuner requires a control device, such as a microprocessor of the TV set, with different software from the above-described tuners that have previously been used, since on one hand different switch outputs of the integrated switchgear are necessary and on the other hand, a switch logic with opposite polarity from its own must be used. Thus such a tuner is incompatible with previously known tuners.

The switch outputs of the integrated circuit that are used by such tuners cannot additionally be used for switching tasks outside the tuner, because that does not accord with the conventional standard at present.

It is accordingly an object of the invention to provide a circuit configuration for range switching in tuners, which overcomes the hereinafore-mentioned disadvantages of the heretofore-known devices of this general type, which is compatible both in function and in software with earlier tuners, and in which the expense for circuitry and space required is reduced over previously known circuits.

With the foregoing and other objects in view there is provided, in accordance with the invention, a circuit configuration for range switching in tuners having at least two ranges, comprising at least two preselector stages each being assigned to a respective tuner range, each of said preselector stages being connected between a supply potential terminal and a reference potential terminal, and each of said preselector stages having an input terminal, an output terminal and an MOS tetrode with a source terminal; a switchgear having switch outputs to be connected to the reference potential terminal for activating each of said MOS tetrodes; and at least one resistor connected between the source terminal of at least one of said MOS tetrodes and at least one of said switch outputs.

In accordance with another feature of the invention, the MOS tetrodes have first and second gate terminals, and at least one of said preselector stages has a first voltage divider being connected between the supply potential terminal and the reference potential terminal with a connecting point connected to the source terminal, and a second voltage divider being connected between the supply potential terminal and the reference potential terminal with a connecting point connected to the first gate terminal, said first and second voltage dividers providing a negative voltage at the source terminal being high enough to pinch or cut-off a channel forming in said MOS tetrode and remaining below a response threshold of protective diodes connected to the first and second gate terminals.

In accordance with a further feature of the invention, there is provided a switch diode having an anode and a cathode, the cathode of said switch diode being connected to the input terminal of said at least one preselector stage, a resistor having a high impedance in comparison with the input impedance of said at least one preselector stage being connected between the cathode of said switch diode and one of said switch outputs of said switchgear, a third voltage divider being connected between the supply potential terminal and the reference potential terminal with a connecting point connected to the anode of said switch diode, a terminal for supplying an HF signal, and a coupling element connected between the anode of said switch diode and said terminal.

In accordance with an added feature of the invention, the switchgear is an integrated circuit.

In accordance with an additional feature of the invention, the integrated circuit has all of the stages necessary for frequency setting and range switching.

In accordance with a concomitant feature of the invention, the at least one resistor connected to the source terminal of said MOS tetrode is dimensioned for establishing an operating point of said MOS tetrode intended for optimal amplification.

Other features which are considered as characteristic for the invention are set forth in the appended claims.

Although the invention is illustrated and described herein as embodied in a circuit configuration for range switching in tuners, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a known circuit configuration for range switching in tuners with switch transistors; and FIG. 2 is a diagram of a circuit configuration according to the invention for range switching and tuners with MOS tetrodes having source connections which can be switched to reference potential.

The invention is described below in further detail along with the figures of the drawings, in terms of an example for range switching to the VHF-I range, while the circuit configurations are similarly laid out for other ranges, such as VHF II and UHF.

Referring now to the figures of the drawing in detail and first, particularly, to FIG. 1 thereof, there is seen an input stage of a known television tuner. The input stage has three preselector stages 1, 1' and 1" with MOS tetrodes 4 for amplifying an antenna signal to be applied to a terminal 20. This antenna signal reaches the cathodes of three switch diodes 37, 37' and 37" through a coupling element 21, such as a coupling capacitor. The anodes of the switch diodes 37, 37' and 37" are each connected to a respective input clamp 7, 7' and 7" of the preselector stages 1, 1' and 1". One high-frequency-amplified signal for each range can be picked up from the applicable preselector stage 1, 1' and 1" at output terminals 8, 8' and 8". For the sake of simplicity, only the preselector stage 1 for a first range, in this case the VHF-I range as an example, is shown in detailed form with its individual circuit components. These are also known from the aforementioned Siemens data book 1986/1987. The circuit configuration will therefore only be discussed below to the extent necessary for comprehension of the invention.

A source terminal S of the MOS tetrode 4 is connected to a connecting point of a first voltage divider 15, and a first gate terminal G1 thereof is connected to a connecting point of a second voltage divider 16, for setting an operating point. Both voltage dividers 15 and 16 are located between a reference potential terminal 6 and a terminal 43, which is switchable by a pnp switch transistor 40 to a supply potential terminal 5 to which positive voltage is applied. To this end, the collector terminal of the pnp switch transistor 40 is connected to the terminal 43, and its base terminal is connected through a base resistor 42 to a switch output 14 of a switchgear 9. On one hand, the emitter terminal of the pnp switch transistor 40 is connected through an emitter resistor 41 to the base terminal of the pnp switch transistor 40, and on the other hand it is connected to the supply potential terminal 5. The switch output 14 of the switchgear 9 is controlled by means of one or more control signals, through one or more control terminals 11. Additionally, the anode of the switch diode 37 is connected through a resistor 39 to the terminal 43 of the preselector stage 1.

If, by specification of the control signal or signals applied to the control terminal or terminals 11, the switch output 14 of the switchgear 9 is switched to low impedance or in other words to reference potential upon selection of the VHF range by means of control elements of the TV set, then the pnp switch transistor 40 turns on. The positive voltage at the supply potential terminal 5 thus reaches the terminal 43, causing the preselector stage 1 to be connected to positive voltage and thus activated. At the same time the switch diode 37 becomes conducting, because its cathode is then more negative than its anode. The current for switching this switch diode 37 is furnished by the pnp switch transistor 40. The antenna signal applied to the terminal 20, which is to be amplified, is thus amplified in the preselector stage 1 and is available at the output terminal 8.

The switchover to the other range, in this case to the preselector stages 1' and 1" for the VHF-II and UHF range, is effected analogously through switch outputs 14' and 14" of the switchgear 9 and additionally by means of the circuit components bearing reference numerals 7', 37', 40', 41', 42' and 43', as well as 7", 37", 40", 41", 42" and 43". When the reference numerals are the same they represent analogous switch elements. In the case of a low-impedance switch output 14', the preselector stage 1' accordingly becomes active, while in the case of a low impedance switch output 14", the preselector stage 1" is switched to the supply potential terminal 5 and thus works as an amplifier, through the pnp switch transistor 40" that is then turned on.

The switch outputs 14, 14' and 14" of the switchgear 9 are current-limited open collector outputs. A current limitation in the switchgear 9 prevents an overly high base current of the pnp switch transistors 40, 40' and 40".

FIG. 2 shows an exemplary embodiment of a circuit configuration according to the invention for range switching in tuners with two ranges. Reference numerals that are the same as in FIG. 1 indicate identical circuit elements. Unlike FIG. I, the anodes of three switch diodes 17, 17' and 17" are connected to the coupling capacitor 21, and the cathodes thereof are each connected to a respective input terminal 7, 7' and 7" of the preselector stages 1, 1' and 1". As will be explained below, these switch diodes 17, 17', 17" are not absolutely necessary for the invention. Moreover, according to the invention and in contrast to the circuit configuration shown in FIG. 1, the source terminal S of the MOS tetrode 4 is connected through a resistor 10 and a terminal 2 to a switch output 12 of the switchgear 9.

By specifying one or more control signals to be applied to one or more control terminals 11 of the switchgear 9, this switch output 12 of the switchgear 9 can be switched to reference potential and thus connected to the reference potential terminal 6, as a result of which the MOS tetrode 4 and thus the preselector stage 1 are activatable.

In order to ensure that the MOS tetrode 4 will be switched off whenever the switch output 12 is not at reference potential, two voltage dividers which are tuned to one another and connected between the supply potential terminal 5 and the reference potential terminal 6, are connected to the MOS tetrode 4. The first voltage divider 15, which may include two resistors, has a connecting point which is connected to the source terminal S, and the second voltage divider 16, which may also include two resistors, has a connecting point which is connected to a first gate terminal G1 of the MOS tetrode 4. The first voltage divider 15 and second voltage divider 16 are adjusted in such a way that a negative voltage is attained at the source terminal S of the MOS tetrode 4, which on one hand is high enough to pinch off a channel forming in the MOS tetrode 4 and on the other hand remains below the response threshold of protective diodes connected to the first gate terminal G1 and a second gate terminal G2 of the MOS tetrode 4.

As long as the switch output 12 has not yet been switched to reference potential, the MOS tetrode 4 is without current, and HF amplification is not possible. In contrast, if the preselector stage 1 is to be activated, the switch output 12 of the switchgear 9 is connected to reference potential by the specification of one or more control signals to be applied to one or more input terminals 11 of the switchgear 9, and thus the source terminal S of the MOS tetrode 4 is connected to the reference potential terminal 6 through the resistor 10. This resistor 10, which is connected parallel to one resistor of the first voltage divider 15, is advantageously dimensioned in such a way that the operating point of the MOS tetrode 4 that is intended for optimal amplification is established.

It is additionally advantageous, but not mandatory, that the aforementioned switch diode 17 be provided with the cathode thereof connected to the input terminal 7 of the preselector stage 1, that it be connected through a resistor 18 of high impedance in comparison with the input impedance of the preselector stage 1, to the switch output 12 of the switchgear 9, and that a third voltage divider 19, connected between the supply potential terminal 5 and the reference potential terminal 6, be provided with a connecting point thereof connected to the anode of the switch diode 17.

As long as the switch output 12 is not at reference potential, the effect of this structure is that the switch diode 7 blocks, and therefore no antenna signal reaches the input terminal 7 of the preselector stage 1. The switch diode 17 blocks this range since, as a result of the third voltage divider 19, the anode of the switch diode 17 is more negative than the cathode, which is connected to the source terminal S of the MOS tetrode 4 through the resistor 10 and through the resistor 18, which is connected between the cathode of the switch diode 17 and the switch output 12.

In contrast, if the preselector stage 1 is activated, and the MOS tetrode 4 of this preselector stage 1 is accordingly switched on, by applying the switch output 12 of the switchgear 9 to reference potential, then the switch diode 17 carries current, since its anode potential becomes more positive than its cathode potential.

As is shown in FIG. 2, the other preselector stages 1' and 1" of the other ranges provided in the tuner may be connected in the same way to further switch outputs 12' and 12" of the switchgear 9 and may be connected through further switch diodes 17' and 17" to the coupling capacitor 21 of the antenna input terminal 20. The switch outputs 12' and 12" should be connected to terminals 2' and 2" of the preselector stages 1' and 1", each of which is in turn connected through a respective resistor to the source terminal of the applicable MOS tetrode of the preselector stage 1' and 1". Furthermore, for these two preselector stages 1' and 1" as well, resistors 18' and 18" are each respectively connected between the cathode of the switch diodes 17' and 17" and the input terminals 2' and 2" of the preselector stages 1' and 1". A switchover between the preselector stages 1, 1' and 1" and thus among the ranges VHF I, VHF II and UHF is made through the switch outputs 12, 12' and 12" of the switchgear 9, depending on which of these switch outputs 12, 12' and 12" is presently at reference potential, by specifying the control signal of the switchgear 9 applied at the control terminal 11.

An integrated circuit which has the switch outputs 12, 12' and 12" required for range switching and need not have any current limitation, is particularly suitable as the switchgear 9. It is particularly advantageous then that the triggering of the switch outputs 12, 12' and 12" be constructed to be compatible with the control software of tuners that are known thus far. The switchgear 9 can moreover be included in an integrated PLL (phase-locked loop) circuit, for instance, which has all of the stages necessary for frequency setting and band switching.

It has been found that switch transistors provided in the switchgear 9 for triggering the switch outputs 12, 12' and 12" should be dimensioned in such a way that for a voltage strength of approximately 12 V, they can switch a current of approximately 25 mA.

The principle of the present invention and thus the switching off of a preselector stage through the source potential of an MOS tetrode is suitable for all tuners, in particular those with VHF tuned circuits that can be switched over with switch diodes, and also for those that work without switch diodes.

The most substantial advantage of the invention is that the circuit configuration for range switching of the tuner is compatible in terms of both function and software with previous circuit configurations, and the expense for circuitry and space required is reduced as compared with previously known circuit configurations.

I claim:

1. A circuit configuration for range switching in tuners having at least two ranges, comprising at least two preselector stages each being assigned to a respective tuner range, each of said preselector stages being connected between a supply potential terminal and a reference potential terminal, and each of said preselector stages having an input terminal, an output terminal and an MOS tetrode with a source terminal; a switchgear having switch outputs to be connected to the reference potential terminal for activating each of said MOS tetrodes; and at least one resistor connected between the source terminal of at least one of said MOS tetrodes and at least one of said switch outputs.

2. The circuit configuration according to claim 1, wherein said MOS tetrodes have first and second gate terminals, and at least one of said preselector stages has a first voltage divider being connected between the supply potential terminal and the reference potential terminal with a connecting point connected to the source terminal, and a second voltage divider being connected between the supply potential terminal and the reference potential terminal with a connecting point connected to the first gate terminal, said first and second voltage dividers providing a negative voltage at the source terminal being high enough to pinch off a channel forming in said MOS tetrode and remaining below a response threshold of protective diodes connected to the first and second gate terminals.

3. The circuit configuration according to claim 2, including a switch diode having an anode and a cathode, the cathode of said switch diode being connected to the input terminal of said at least one preselector stage, a resistor having a high impedance in comparison with the input impedance of said at least one preselector stage being connected between the cathode of said switch diode and one of said switch outputs of said switchgear, a third voltage divider being connected between the supply potential terminal and the reference potential terminal with a connecting point connected to the anode of said switch diode, a terminal for supplying an HF signal, and a coupling element connected between the anode of said switch diode and said terminal.

4. The circuit configuration according to claim 1, wherein said switchgear is an integrated circuit.

5. The circuit configuration according to claim 4, wherein said integrated circuit has all of the stages necessary for frequency setting and range switching.

6. The circuit configuration according to claim 1, wherein said at least one resistor connected to the source terminal of said MOS tetrode is dimensioned for establishing an operating point of said MOS tetrode intended for optimal amplification.

* * * * *